(12) United States Patent
Liao et al.

(10) Patent No.: US 7,629,741 B2
(45) Date of Patent: *Dec. 8, 2009

(54) OLED ELECTRON-INJECTING LAYER

(75) Inventors: Liang-Sheng Liao, Rochester, NY (US);
Wojciech K. Slusarek, Rochester, NY (US); Michele L. Ricks, Rochester, NY (US); Ralph H. Young, Rochester, NY (US); Dustin L. Comfort, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 593 days.

This patent is subject to a terminal disclaimer.

(21) Appl. No.: 11/124,300

(22) Filed: May 6, 2005

(65) Prior Publication Data

US 2006/0251922 A1 Nov. 9, 2006

(51) Int. Cl.
*H01L 51/54* (2006.01)

(52) U.S. Cl. .................. 313/506; 313/504; 428/690; 428/917; 257/E51.043; 257/E51.05

(58) Field of Classification Search ............... 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | | | |
|---|---|---|---|---|
| 3,115,506 | A | * | 12/1963 | Acker et al. ............... 552/303 |
| 4,356,429 | A | | 10/1982 | Tang |
| 5,343,050 | A | * | 8/1994 | Egusa et al. ............... 257/40 |
| 6,013,384 | A | * | 1/2000 | Kido et al. ............... 428/690 |
| 6,436,559 | B1 | | 8/2002 | Ueno et al. |
| 7,494,722 | B2 | * | 2/2009 | Liao et al. ............... 428/690 |

| | | | |
|---|---|---|---|
| 2005/0104511 | A1 | 5/2005 | Liao et al. |

FOREIGN PATENT DOCUMENTS

| | | | |
|---|---|---|---|
| EP | 1 099 744 | | 5/2001 |
| JP | 2002-100477 | * | 5/2002 |
| JP | 2004031213 | * | 1/2004 |
| WO | 2006/0915660 | | 8/2006 |

OTHER PUBLICATIONS

Wheland et al., "Synthesis of substituted 7,7,8,8-tetracyanoquinodimethanes," Journal of Organic Chemistry, vol. 40, No. 21, pp. 3101-3109, Oct. 1975.*
Kenny, Peter W., "Prediction of planarity and reduction potential of derivatives of tetracyanoquinodimethane using ab initio molecular orbital theory," Journal of the Chemical Society, Perkin Transactions 2, pp. 907-909, 1995.*
Shi et al., "Fluoroperylene diimide: a soluble and air-stable electron acceptor," Chemical Communications, No. 14, pp. 1710-1711, Jun. 2003.*
Machine Translation of JP 200431213.*
Machine Translation of JP 2002-100477. (May 2002).*
Polymer Preprints, 40, 404 (199).

* cited by examiner

*Primary Examiner*—Marie R. Yamnitzky
(74) *Attorney, Agent, or Firm*—Raymond L. Owens

(57) ABSTRACT

An OLED includes an anode, a light-emitting layer disposed over the anode, and a first electron-injecting layer disposed over the light-emitting layer, wherein the first electron-injecting layer includes at least one organic host material having a reduction potential less than −1.0 V vs. a Saturated Calomel Electrode and at least one dopant material capable of reducing the organic host material. The OLED also includes a second electron-injecting layer disposed in contact with the first electron-injecting layer, wherein the second electron-injecting layer includes at least one organic material having a reduction potential greater than −1.0 V vs. a Saturated Calomel Electrode, and a cathode disposed over the second electron-injecting layer.

13 Claims, 7 Drawing Sheets

OLED ELECTRON-INJECTING LAYER

CROSS REFERENCE TO RELATED APPLICATIONS

Reference is made to commonly assigned U.S. patent application Ser. No. 10/824,086 filed Apr. 14, 2005 (now U.S. Pat. No. 7,192,659) by Michele L. Ricks et al., entitled "OLED Device Using Reduced Drive Voltage"; commonly assigned U.S. patent application Ser. No. 11/111,386 filed Apr. 21, 2005 (U.S. Patent Application Publication No. 2006/0240281) by Liang-Sheng Liao et al., entitled "Contaminant-Scavenging Layer on OLED Anodes"; and U.S. patent application Ser. No. 11/111,367 filed Apr. 21, 2005 (U.S. Patent Application Publication No. 2006/0240280) by Liang-Sheng Liao et al., entitled "OLED Anode Modification Layer", the disclosures of which are herein incorporated by reference.

FIELD OF INVENTION

The present invention relates to an organic light-emitting device (OLED) in which an organic material having a strong oxidizing property is used in an electron-injecting layer of the device.

BACKGROUND OF THE INVENTION

OLEDs, as described by Tang in commonly assigned U.S. Pat. No. 4,356,429, are commercially attractive because they offer the promise of low cost fabrication of high density pixel displays exhibiting bright electroluminance (EL) with long lifetime, high luminous efficiency, low drive voltage, and wide color range.

A typical OLED includes two electrodes and one organic EL unit disposed between the two electrodes. The organic EL unit commonly includes an organic hole-transporting layer (HTL), organic light-emitting layer (LEL), and an organic electron-transporting layer (ETL). One of the electrodes is the anode, which is capable of injecting positive charges (holes) into the HTL of the EL unit, and the other electrode is the cathode, which is capable of injecting negative charges (electrons) into the ETL of the EL unit. When the anode is biased with a certain positive electrical potential relative to the cathode, holes injected from the anode and electrons injected from the cathode can recombine and emit light from the LEL. At least one of the electrodes is optically transmissive, and the emitted light can be seen through the transmissive electrode.

Significant efforts have been made in selecting suitable materials and forming different layer structures in OLEDs to achieve improved EL performance. Numerous OLEDs with alternative layer structures have been disclosed. For example, in addition to the three layer OLEDs that contain a LEL between the HTL and the ETL (denoted as HTL/LEL/ETL), there are other multilayer OLEDs that contain additional functional layers in the EL unit, such as a hole-injecting layer (HIL), an electron-injecting layer (EIL), an electron-blocking layer (EBL), or a hole-blocking layer (HBL), or the combination thereof. These new layer structures with new materials have indeed resulted in improved device performance.

As is known, electron transport in OLED is generally less efficient than hole transport. As a result, the electron-hole recombination in LEL is sometimes unbalanced with insufficient electrons. In order to achieve more efficient electron-hole recombination, much attention has been paid in forming an effective ETL or EIL using suitable electron-transporting material (ETM) in OLEDs. For example, the commonly used ETL or EIL in OLEDs includes the ETM of tris(8-hydroxyquinoline)aluminum (Alq), 4,7-diphenyl-1,10-phenanthroline (Bphen), 2,9-dimethyl-4,7-diphenyl-1,10-phenanthroline (BCP), and 2,2'-[1,1'-biphenyl]-4,4'-diylbis[4,6-(p-tolyl)-1,3,5-triazine] (TRAZ).

According to prior art, the selection of practically useful organic ETMs in OLEDs is limited to those having a reduction potential less than −1.0 V vs. a Saturated Calomel Electrode (SCE) or having a LUMO less than 3.3 eV below the vacuum energy level ($E_{vac}$). This is because the LEL in an OLED typically has a reduction potential less than −1.0 V vs. SCE. Therefore if any organic material having a reduction potential greater than −1.0 V vs. SCE were used as an ETL in the OLED, it would produce an electron injection barrier between the ETL and the LEL. Especially, if any organic material having a reduction potential greater than −0.5 V vs. SCE were used as an ETL in the OLED, it would produce an electron injection barrier greater than 0.5 eV. Electron injection from the ETL into the LEL would be very difficult or impossible, resulting in little or no EL emission from the OLED. However, the commonly used ETMs, although forming a low or no barrier for electron injection at LEL/ETL interface, exhibit a relatively high barrier for electron injection at the interface between the ETL and the cathode, especially when the cathode material has a work function higher than 4.0 eV. This high barrier interface between the ETL and the cathode can be modified by inserting a thin insulating layer or by doping the ETL with a material having a work function lower than 3.0 eV, but this interface will be degraded eventually during operation.

Therefore, it would be advantageous to find a way to broaden the material selection for ETL (EIL), to use the material having a reduction potential greater than that of commonly used ETMs, and to produce a stable interface between organic layer and the cathode in OLEDs.

SUMMARY OF THE INVENTION

It is therefore an object of the present invention to improve the EL performance of the OLED.

The object is achieved by an organic light-emitting device (OLED) comprising:
 a) an anode;
 b) a light-emitting layer disposed over the anode;
 c) a first electron-injecting layer disposed over the light-emitting layer, wherein the first electron-injecting layer includes at least one organic host material having a reduction potential less than −1.0 V vs. a Saturated Calomel Electrode and at least one dopant material capable of reducing the organic host material;
 d) a second electron-injecting layer disposed in contact with the first electron-injecting layer, wherein the second electron-injecting layer includes at least one organic material having a reduction potential greater than −1.0 V vs. a Saturated Calomel Electrode; and
 e) a cathode disposed over the second electron-injecting layer.

The present invention makes use of a second electron-injecting layer including an organic material having a reduction potential greater than −1.0 eV in direct contact with the cathode and forming a stable interface between the cathode and this layer with no electron injection barrier from the cathode into the electron-injecting layer. It is an advantage of the present invention that the OLED with the second electron-injecting layer can not only increase the lifetime but also reduce the voltage rise during operation, which is useful for making high quality active matrix OLED display and other electronic devices. It is another advantage of the present invention that a stable metal, such as Ag, Au, Al, and Cu, can be used to form the cathode. These stable metals do not readily react with water or oxygen to form dark spots in the OLEDs.

It will be understood that FIGS. 1-5 are not to scale since the thickness differences of various layers are too great to permit depiction to scale.

DETAILED DESCRIPTION OF THE INVENTION

Figure 1:
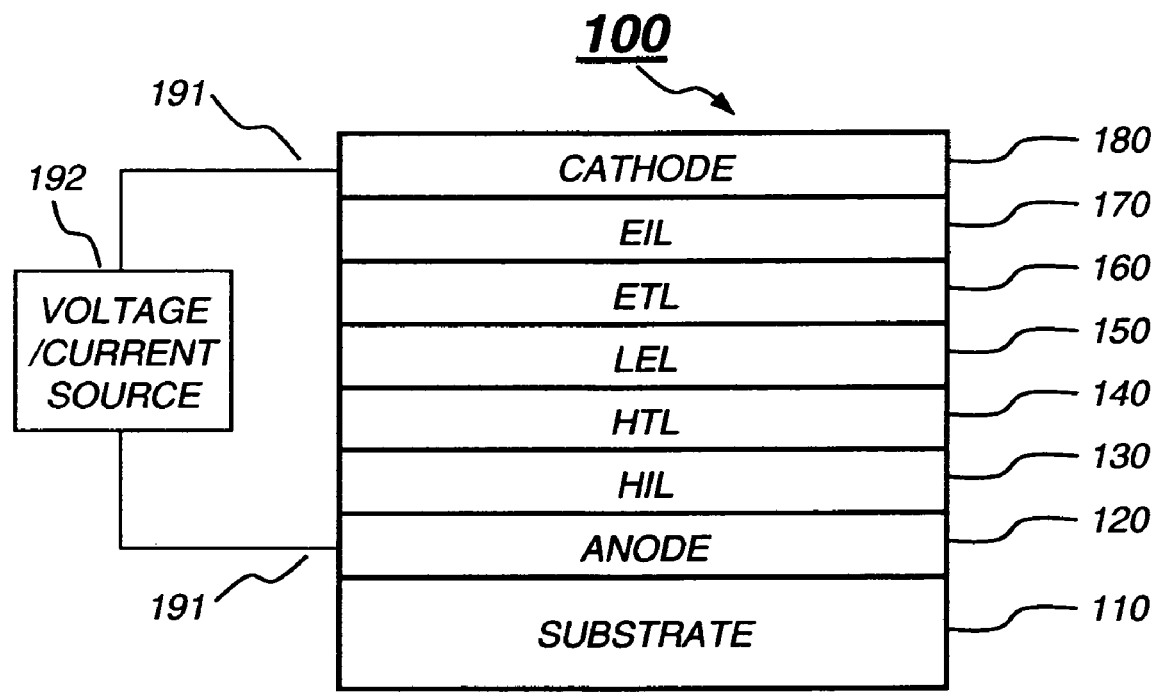
FIG. 1 shows a cross-sectional view of a prior art OLED.

There is shown a cross-sectional view of a prior art OLED in FIG. 1. OLED 100 includes substrate 110, anode 120, HIL 130, HTL 140, LEL 150, ETL 160, EIL 170, and cathode 180 (HIL 130, HTL 140, LEL 150, ETL 160, and EIL 170 form an organic EL unit in between the anode 120 and cathode 180). OLED 100 is externally connected to a voltage/current source 192 through electrical conductors 191. OLED 100 is operated by applying an electric potential produced by the voltage/current source 192 between the pair of contact electrodes, anode 120, and cathode 180.

Figure 2:
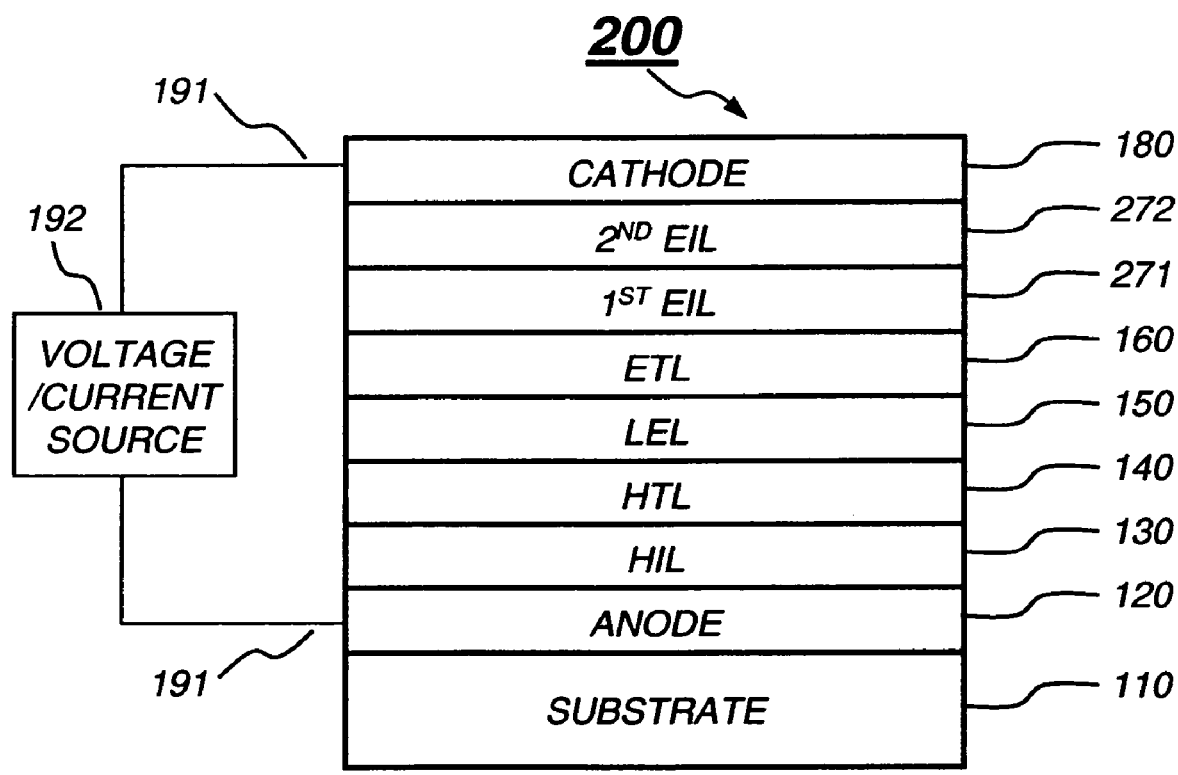
FIG. 2 shows a cross-sectional view of one embodiment of an OLED prepared in accordance with the present invention.
Figure 3:
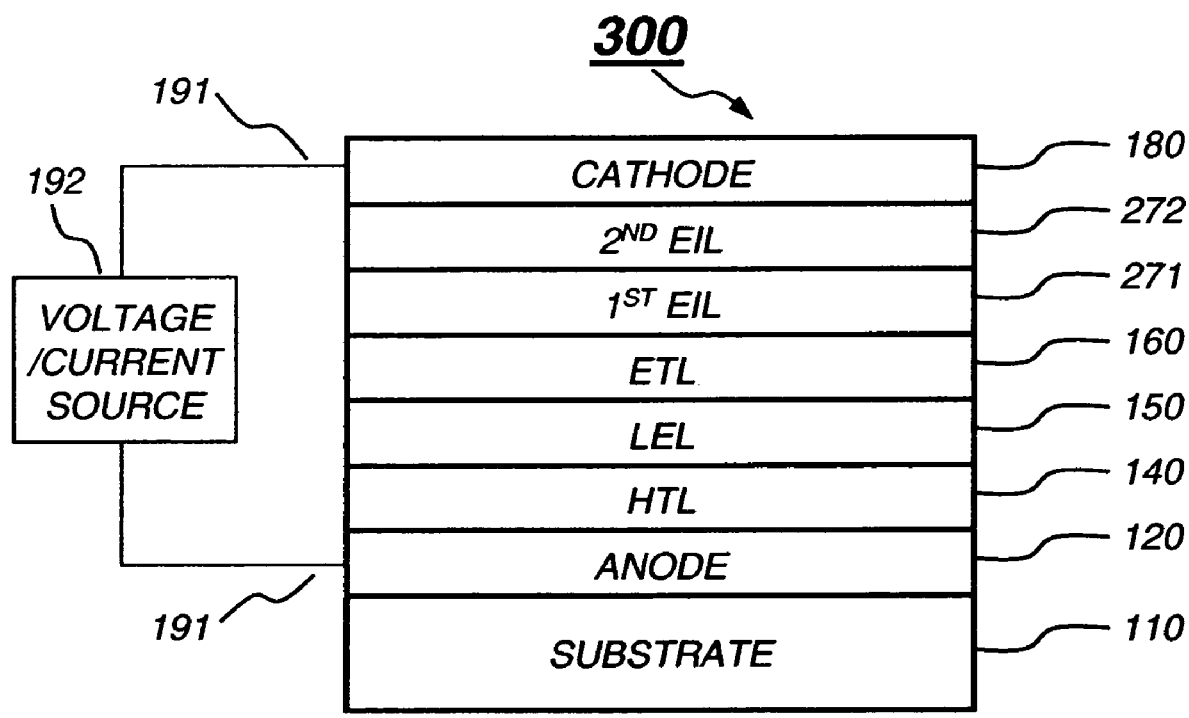
FIG. 3 shows a cross-sectional view of another embodiment of an OLED prepared in accordance with the present invention.
Figure 4:
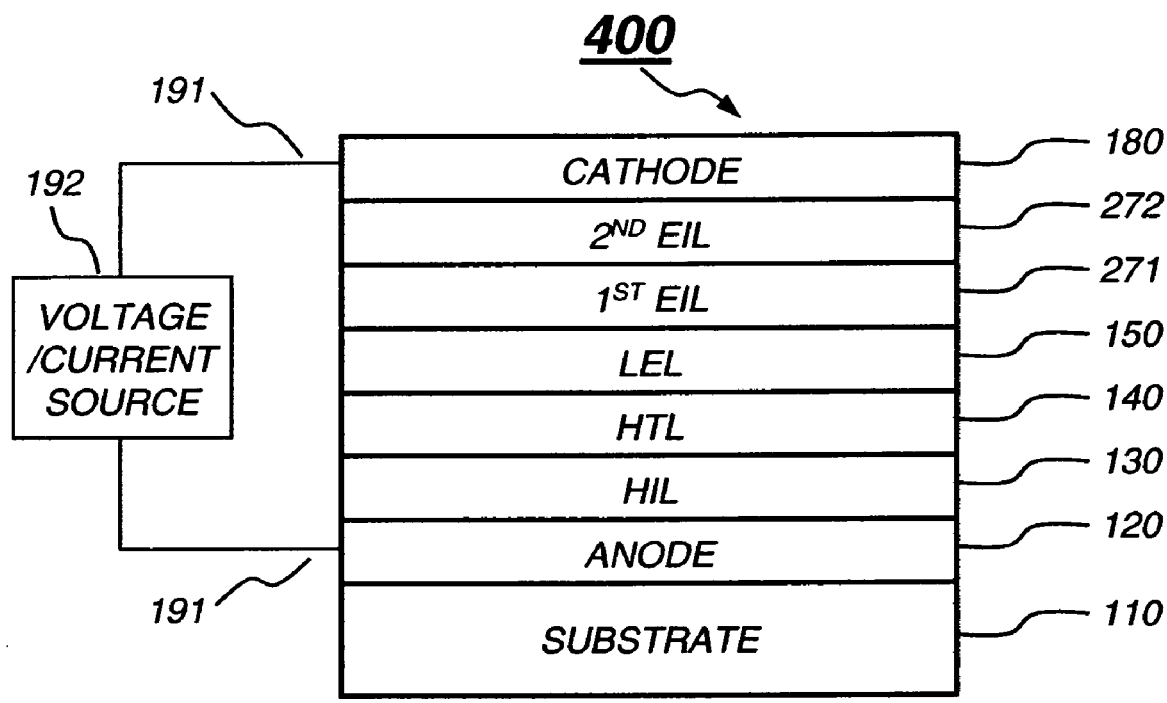
FIG. 4 shows a cross-sectional view of yet another embodiment of an OLED prepared in accordance with the present invention.
Figure 5:
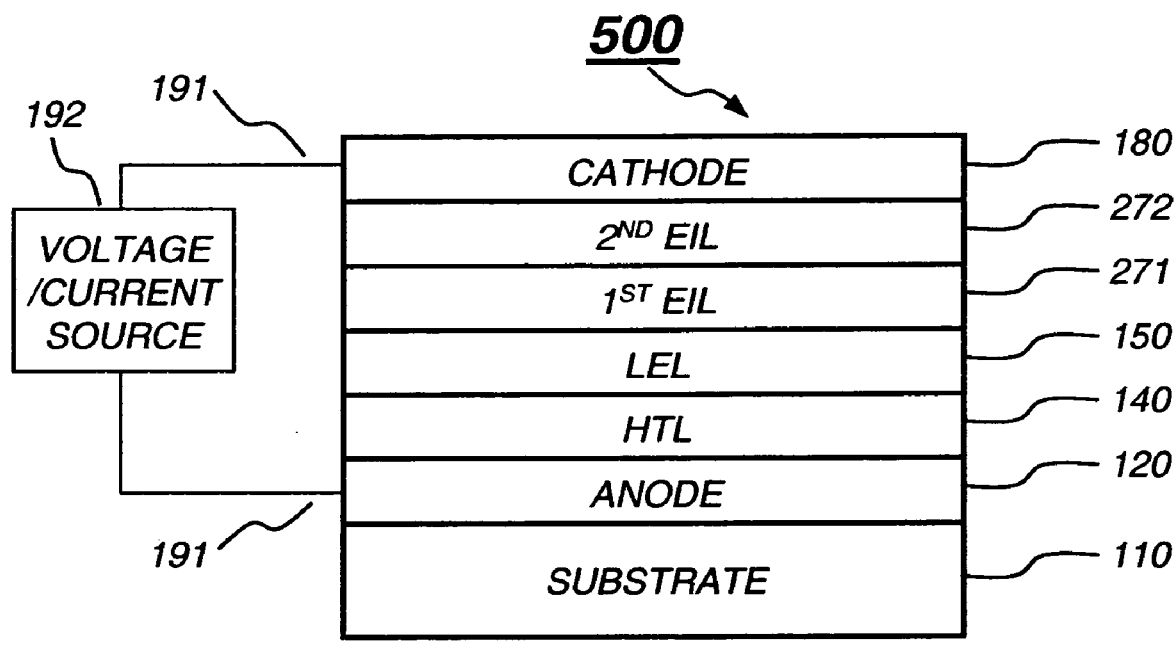
FIG. 5 shows a cross-sectional view of yet another embodiment of an OLED prepared in accordance with the present invention.

There is shown a cross-sectional view of one embodiment of an OLED in accordance with the present invention in FIG. 2. OLED 200 includes substrate 110, anode 120, HIL 130, HTL 140, LEL 150, ETL 160, the 1$^{st}$ EIL 271, the 2$^{nd}$ EIL 272, and cathode 180. OLED 200 is the same as OLED 100 except that OLED 200 has two EILs (EIL 271 and EIL 272). OLED 200 is also externally connected to a voltage/current source 192 through electrical conductors 191. Shown in FIGS. 3, 4, and 5 are OLED 300, OLED 400, and OLED 500, respectively, which are some other embodiments of OLEDs prepared in accordance with the present invention. OLED 300 in FIG. 3 is the same as OLED 200 except that there is no HIL 130 in OLED 300; OLED 400 in FIG. 4 is the same as OLED 200 except that there is no ETL 160 in OLED 400; and OLED 500 in FIG. 5 is the same as OLED 200 except that there is no HIL 130 nor ETL 160 in OLED 500. Note that the substrate can alternatively be located adjacent to the cathode, or the substrate can actually constitute the anode or cathode. The total combined thickness of the organic layers is preferably less than 500 nm.

The present invention can be employed in the making of most OLED device configurations. These include very simple structures including a single anode and cathode to more complex devices, such as passive matrix displays including orthogonal arrays of anodes and cathodes to form pixels, and active matrix displays where each pixel is controlled independently, for example, with thin film transistors (TFTs). Such TFTs can be constructed using amorphous silicon, low temperature polycrystalline silicon, single crystal silicon, other inorganic semiconductors, or organic semiconductor materials.

The following will be the description of the device structure, material selection, and fabrication process of the OLEDs in accordance with the present invention.

Substrate 110 can be an organic solid, an inorganic solid, or includes organic and inorganic solids that provides a supporting backplane to hold the OLED. Substrate 110 can be rigid or flexible and can be processed as separate individual pieces, such as sheets or wafers, or as a continuous roll. Typical substrate materials include glass, plastic, metal, ceramic, semiconductor, metal oxide, semiconductor oxide, or semiconductor nitride, or combinations thereof. Substrate 110 can be a homogeneous mixture of materials, a composite of materials, or multiple layers of materials. Substrate 110 can also be a backplane containing thin-film transistor (TFT) circuitry commonly used for preparing OLED display, e.g. an active matrix low temperature polysilicon TFT substrate. The substrate 110 can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, ceramics, and circuit board materials, or any others commonly used in the formation of OLEDs, which can be either passive matrix devices or active matrix devices.

Anode 120 is formed over substrate 110. When EL emission is viewed through the substrate 110, the anode should be transparent or substantially transparent to the emission of interest. For applications where EL emission is viewed through the top electrode, the transmissive characteristics of the anode material are immaterial and any conducting or semiconducting material can be used, regardless if it is transparent, opaque, or reflective. Desired anode materials can be deposited by any suitable way such as thermal evaporation, sputtering, chemical vapor deposition, or electrochemical means. Anode materials can be patterned using well known photolithographic processes.

The material for use to form anode 120 can be selected from inorganic materials, or organic materials, or combination thereof. The anode 120 can contain the element material selected from aluminum, silver, gold, copper, zinc, indium, tin, titanium, zirconium, hafnium, niobium, tantalum, molybdenum, tungsten, manganese, iron, ruthenium, rhodium, iridium, nickel, palladium, platinum, silicon, or germanium, or combinations thereof. The anode 120 can also contain a compound material, such as a conducting or semiconducting compound. The conducting or semiconducting compound can be selected from the oxides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. The conducting or semiconducting compound can be selected from the sulfides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. The conducting or semiconducting compound can be selected from the selenides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. The conducting or semiconducting compound can be selected from the tellurides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. The conducting or semiconducting compound can be selected from the nitrides of titanium, zirconium, hafnium, niobium, tantalum, molybdenum, tungsten, manganese, iron, ruthenium, rhodium, iridium, nickel, palladium, platinum, copper, zinc, indium, tin, silicon, or germanium, or combinations thereof. Preferably, the conducting or semiconducting compound can be selected from indium tin oxide, tin oxide, aluminum-doped zinc oxide, indium-doped zinc oxide, magnesium indium oxide, nickel tungsten oxide, zinc sulfide, zinc selenide, or gallium nitride, or the combination thereof.

It is often useful to provide a hole-injecting layer 130 between anode 120 and hole-transporting layer 140. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075 and 6,208,077, some aromatic amines, for example, m-MTDATA (4,4',4"-tris[(3-methylphenyl)phenyl-amino]triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1. Hexaazatriphenylene derivatives are also useful HIL materials, as described in U.S. Pat. No. 6,720,573.

Another class of suitable materials for use in the HIL includes p-type doped organic materials. A p-type doped organic material typically includes a hole-transporting material such as an aromatic amine (see below) that is doped with an electron accepting dopant. Such dopants can include, for example, 2,3,5,6-tetrafluoro-7,7,8,8-tetracyanoquinodimethane (F4-TCNQ) and other derivatives of 7,7,8,8-tetracyanoquinodimethane (TCNQ), and inorganic oxidizing agents such as iodine, FeCl3, FeF3, SbCl5, some other metal chlorides, and some other metal fluorides. The p-type doped concentration is preferably in the range of 0.01-20 vol. %. Such layers materials are further described in, for example, U.S. Pat. Nos. 5,093,698, 6,423,429, and 6,597,012.

The thickness of the HIL can be in the range of from 0.1 nm to 200 nm, preferably, in the range of from 0.5 nm to 150 nm.

The HTL 140 contains at least one hole-transporting material such as an aromatic tertiary amine, where the aromatic tertiary amine is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals or at least one active hydrogen-containing group are disclosed by Brantley, et al. in U.S. Pat. Nos. 3,567,450 and 3,658,520.

A more preferred class of aromatic tertiary amines includes compounds that include at least two aromatic tertiary amine moieties as described by Van Slyke and Tang et al. in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1":4",1'''-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N-tetra-1-naphthyl-4,4'-diaminobiphenyl;
N,N,N',N'-tetra-2-naphthyl-4,4-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl) amino]naphthalene;
N,N,N',N'-Tetra(2-naphthyl)-4,4"-diamino-p-terphenyl;
4,4'-Bis{N-phenyl-N-[4-(1-naphthyl)-phenyl] amino}biphenyl;
2,6-Bis[N,N-di(2-naphthyl)amino]fluorene;
4,4',4"-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Some hole-injecting materials described in EP 0 891 121 A1 and EP 1 029 909 A1 can also make useful hole-transporting materials. In addition, polymeric hole-transporting materials can be used including poly(N-vinylcarbazole) (PVK), polythiophenes, polypyrrole, polyaniline, and copolymers including poly(3,4-ethylenedioxy-thiophene)/poly(4-styrenesulfonate) also called PEDOT/PSS.

The thickness of the HTL can be in the range of from 5 nm to 200 nm, preferably, in the range of from 10 nm to 150 nm.

The LEL 150 can include a luminescent fluorescent or phosphorescent material where electroluminescence is produced as a result of electron-hole pair recombination in this layer. The light-emitting layer can include a single material, but more commonly contains at least one host material doped with at least one guest emitting material or materials where light emission comes primarily from the emitting materials and can be of any color. This guest emitting material is often referred to as a luminescent dopant material. The host materials in the light-emitting layer can be an electron-transporting material as defined below, a hole-transporting material as defined above, or another material or combination of materials that support hole-electron recombination. The emitting material is typically chosen from highly fluorescent dyes and phosphorescent compounds, e.g., transition metal complexes as described in WO 98/55561 A1, WO 00/18851 A1, WO 00/57676 A1, and WO 00/70655. Emitting materials are typically incorporated at 0.01 to 20% by volume of the host material.

The host and emitting materials can be small nonpolymeric molecules or polymeric materials including polyfluorenes and polyvinylarylenes, e.g., poly(p-phenylenevinylene), PPV. In the case of polymers, small molecule emitting materials can be molecularly dispersed into a polymeric host, or the emitting materials can be added by copolymerizing a minor constituent into a host polymer.

An important relationship for choosing an emitting material is a comparison of the electron energy bandgap that is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters (including materials that emit from a triplet excited state, i.e., so-called "triplet emitters") it is also important that the triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, 6,020,078, 6,475,648, 6,534,199, 6,661,023, U.S. Patent Application Publications 2002/0127427 A1, 2003/0198829 A1, 2003/0203234 A1, 2003/0224202 A1, and 2004/0001969 A1.

Metal complexes of 8-hydroxyquinoline (oxine), otherwise known as chelated oxinoid compound, and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)];
CO-2: Magnesium bisoxine [alias, bis(8-quinolinolato)magnesium(II)];
CO-3: Bis[benzo {f}-8-quinolinolato]zinc (II);
CO-4: Bis(2-methyl-8-quinolinolato)aluminum(III)-μ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)]

Another class of useful host materials includes derivatives of anthracene, such as those described in U.S. Pat. Nos. 5,935,721, 5,972,247, 6,465,115, 6,534,199, 6,713,192, U.S. Patent Application Publications 2002/0048687 A1, 2003/0072966 A1, and WO 2004/018587. Some examples include derivatives of 9,10-dinaphthylanthracene and 9-naphthyl-10-phenylanthracene. Other useful classes of host materials include distyrylarylene derivatives as described in U.S. Pat. No. 5,121,029, and benzazole derivatives, for example, 2, 2', 2"-(1,3,5-phenylene)tris[1-phenyl-1H-benzimidazole].

Suitable host materials for phosphorescent dopants should be selected so that a triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the bandgap of the host should not be chosen so large as to cause an unacceptable increase in the drive voltage of the OLEDs. Suitable host materials are described in WO 00/70655 A2, WO 01/39234 A2, WO 01/93642 A1, WO 02/074015 A2, WO 02/15645 A1, and U.S. Patent Application Publication 2002/0117662 A1. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), including their derivatives.

Desirable host materials are capable of forming a continuous film. The light-emitting layer can contain more than one host material in order to improve the device's film morphology, electrical properties, light emission efficiency, and lifetime. Mixtures of electron-transporting and hole-transporting materials are known as useful hosts. In addition, mixtures of the above listed host materials with hole-transporting or electron-transporting materials can make suitable hosts.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane boron compounds, derivatives of distryrylbenzene and distyrylbiphenyl, and carbostyryl compounds. Among derivatives of distyrylbenzene, particularly useful are those substituted with diarylamino groups, informally known as distyrylamines.

Examples of useful phosphorescent dopants that can be used in light-emitting layers of this invention include, but are not limited to, those described in WO 00/57676 A1, WO 00/70655, WO 01/41512 A1, WO 02/15645 A1, WO 01/93642 A1, WO 01/39234 A2, WO 02/071813 A1, WO 02/074015 A2, U.S. Patent Application Publications 2003/0017361 A1, 2002/0197511 A1, 2003/0072964 A1, 2003/0068528 A1, 2003/0059646 A1, 2003/0054198 A1, 2003/0124381 A1, 2002/0100906 A1, 2003/0068526 A1, 2003/0068535 A1, 2003/0141809A1, 2003/0040627 A1, 2002/0121638 A1, U.S. Pat. Nos. 6,458,475, 6,573,651, 6,451,455, 6,413,656, 6,515,298, 6,451,415, 6,097,147, EP 1 239 526 A2, EP 1 238 981 A2, and EP 1 244 155 A2. Useful phosphorescent dopants include transition metal complexes, such as iridium and platinum complexes.

In some cases it is useful for one or more of the LELs within an EL unit to emit broadband light, for example white light. Multiple dopants can be added to one or more layers in order to produce a white-emitting OLED, for example, by combining blue- and yellow-emitting materials, cyan- and red-emitting materials, or red-, green and blue-emitting materials. White-emitting devices are described, for example, in EP 1 187 235, EP 1 182 244, U.S. Pat. Nos. 5,683,823, 5,503,910, 5,405,709, 5,283,182, 6,627,333, 6,696,177, 6,720,092, U.S. Patent Application Publications 2002/0186214 A1, 2002/

0025419 A1, and 2004/0009367 A1. In some of these systems, the host for one light-emitting layer is a hole-transporting material. For example, it is known in the art that emitting dopants can be added to the HTL 140, thereby enabling HTL 140 to serve as a host. The thickness of each LEL can be in the range of from 5 nm to 80 nm, preferably, in the range of from 10 nm to 40 nm.

Preferred organic materials for use in forming the ETL 160 are metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds have been listed above from CO-1 to CO-9 (the oxinoid compounds can be used as both the host material in LEL 150 and the electron-transporting material in ETL 160).

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

The $1^{st}$ EIL 271 as shown in FIGS. 2-5 is an n-type doped layer containing at least one electron-transporting material as a host material and at least one n-type dopant material (this EIL can also be called an n-type doped $1^{st}$ EIL 271). The reduction potential of one of the organic host materials in the $1^{st}$ EIL 271 is less than −1.0 V vs. SCE and one of the dopant materials is capable of reducing one of the organic host materials. The term "n-type doped layer" means that this layer has semiconducting properties after doping, and the electrical current through this layer is substantially carried by the electrons. The host material is capable of supporting electron injection and electron transport. The electron-transporting materials used in ETL 160 represent a useful class of host materials for the n-type doped $1^{st}$ EIL 271. Preferred materials are metal chelated oxinoid compounds, including chelates of oxine itself (also commonly referred to as 8-quinolinol or 8-hydroxyquinoline), such as tris(8-hydroxyquinoline)-aluminum (Alq). Other materials include various butadiene derivatives as disclosed by Tang in U.S. Pat. No. 4,356,429, various heterocyclic optical brighteners as disclosed by Van Slyke and Tang et al. in U.S. Pat. No. 4,539,507, triazines, hydroxyquinoline derivatives, benzazole derivatives, and phenanthroline derivatives. Silole derivatives, such as 2,5-bis (2',2''-biphosphoid-6-yl)-1,1-dimethyl-3,4-diphenyl silacyclopentadiene are also useful host organic materials. The combination of the aforementioned host materials is also useful to form the n-typed doped EIL 170. More preferably, the host material in the n-type doped EIL 170 includes Alq, 4,7-diphenyl-1,10-phenanthroline (Bphen), 2,9-dimethyl-4,7-diphenyl-1,10-phenanthroline (BCP), 2,2'-[1,1'-biphenyl]-4,4'-diylbis[4,6-(p-tolyl)-1,3,5-triazine] (TRAZ), or rubrene, or combinations thereof.

Both $1^{st}$ EIL 271 and ETL 160 in the OLEDs can use the same or different material.

The n-type dopant in the n-type doped $1^{st}$ EIL 271 is selected from alkali metals, alkali metal compounds, alkaline earth metals, or alkaline earth metal compounds, or combinations thereof. The term "metal compounds" includes organometallic complexes, metal organic salts, and inorganic salts, oxides and halides. Among the class of metal containing n-type dopants, Li, Na, K, Rb, Cs, Mg, Ca, Sr, Ba, La, Ce, Sm, Eu, Th, Dy, or Yb, and their compounds, are particularly useful. The materials used as the n-type dopants in the n-type doped EIL 170 also include organic reducing agents with strong electron-donating properties. By "strong electron-donating properties" it is meant that the organic dopant should be able to donate at least some electronic charge to the host to form a charge transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component. Preferably, the n-type dopant in the n-type doped $1^{st}$ EIL 271 includes Li, Na, K, Rb, Cs, Mg, Ca, Sr, Ba, La, Ce, Nd, Sm, Eu, Tb, Dy, or Yb, or combinations thereof. The n-type doped concentration is preferably in the range of 0.01-20% by volume of this layer. The thickness of the n-type doped $1^{st}$ EIL 271 is typically less than 200 nm, and preferably in the range of 2 to 150 nm.

The $2^{nd}$ EIL 272 in the OLEDs as shown in FIGS. 2-5 is disposed in contact with the $1^{st}$ EIL 271, and includes at least one organic material having a reduction potential greater than −1.0 V vs. SCE, preferably, greater than −0.5 Vs. SCE.

The organic materials having a reduction potential greater than −1.0 V vs. SCE, especially greater than −0.5 V vs. SCE, are promising n-type semiconducting materials with electron accepting property. The materials can provide effective electron transport in OLEDs. Moreover, when the reduction potential of the materials is greater than −0.5 V vs. SCE, the LUMO position of the material will be lower than 3.8 eV from the $E_{vac}$. Therefore, it is possible to select the $2^{nd}$ EIL 272 according to the work function of the cathode 180 such that the LUMO position of the $2^{nd}$ EIL 272 is below or near the work function of the cathode 180. As a result, there is no electron injection barrier at the interface of the $2^{nd}$ EIL 272 and the cathode 180. Furthermore, by "electron accepting property" it is meant that the organic material has the capability or tendency to accept at least some electronic charge from other types of material that it is adjacent to. Having electron accepting property also means having a strong oxidizing property. Therefore, the $2^{nd}$ EIL 272 can also react with the first several monolayers of the cathode when the cathode layer is formed on top of the $2^{nd}$ EIL 272. As a result, cathode 180 can have an improved contact with the $2^{nd}$ EIL 272 forming a stable interface between the $2^{nd}$ EIL 272 and the cathode 180. The $2^{nd}$ EIL 272 can be as thin as 1 nm. However, it can also be as thick as 200 nm. Preferably, the thickness of $2^{nd}$ EIL 272 is in the range of from 1 to 150 nm.

The term "reduction potential", expressed in volts and abbreviated $E^{red}$, measures the affinity of a substance for an electron: the larger (more positive) the number, the greater the affinity. The reduction potential of a substance can be conveniently obtained by cyclic voltammetry (CV) and it is measured vs. SCE. The measurement of the reduction potential of a substance can be as following: An electrochemical analyzer (for instance, a CHI660 electrochemical analyzer, made by CH Instruments, Inc., Austin, Tex.) is employed to carry out the electrochemical measurements. Both CV and Osteryoung square-wave voltammetry (SWV) can be used to characterize the redox properties of the substance. A glassy carbon (GC) disk electrode (A=0.071 cm$^2$) is used as working electrode. The GC electrode is polished with 0.05 μm alumina slurry, followed by sonication cleaning in deionized water twice and rinsed with acetone between the two water cleanings. The electrode is finally cleaned and activated by electrochemical treatment prior to use. A platinum wire can be used as the counter electrode and the SCE is used as a quasi-reference electrode to complete a standard 3-electrode electrochemical cell. A mixture of acetonitrile and toluene (1:1 MeCN/toluene) or methylene chloride (MeCl$_2$) can be used as organic solvent systems. All solvents used are ultra low water grade (<10 ppm water). The supporting electrolyte, tetrabutylammonium tetrafluoroborate (TBAF) is recrystallized twice in isopropanol and dried under vacuum for three days. Ferrocene (Fc) can be used as an internal standard ($E^{red}_{Fc}$=0.50 V vs. SCE in 1:1 MeCN/toluene, $E^{red}_{Fc}$=0.55 V vs. SCE in $MeCl_2$, 0.1 M TBAF, both values referring to the reduction of the ferrocenium radical anion). The testing solution is purged with high purity nitrogen gas for approximately 15 minutes to remove oxygen and a nitrogen blanket is kept on the top of the solution during the course of the experiments. All measurements are performed at an ambient temperature of 25±1° C. If the compound of interest has insufficient solubility, other solvents can be selected and used by those skilled in the art. Alternatively, if a suitable solvent system cannot be identified, the electron accepting material can be deposited onto the electrode and the reduction potential of the modified electrode can be measured.

Several types of organic materials having a reduction potential greater than −1.0 V vs. SCE, especially greater than −0.5 V vs. SCE, can be used to form the $2^{nd}$ EL 272 in the present invention.

The organic material used in the $2^{nd}$ EIL 272 can be a chemical compound of Formula I

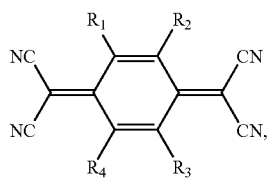

wherein $R_1$-$R_4$ represent hydrogen or substituents independently selected from the group including halo, nitrile (—CN), nitro (—$NO_2$), sulfonyl (—$SO_2R$), sulfoxide (—SOR), trifluoromethyl (—$CF_3$), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein $R_1$ and $R_2$, or $R_3$ and $R_4$, combine form a ring structure including an aromatic ring, a heteroaromatic ring, or a nonaromatic ring, and each ring is substituted or unsubstituted.

Specifically, the organic material used in the $2^{nd}$ EIL 272 can be a chemical compound of Formula Ia (2,3,5,6-tetrafluoro-7,7,8,8-tetracyano-quinodimethane [$F_4$-TCNQ])

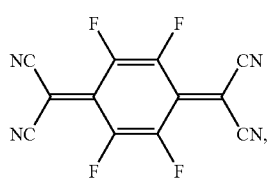

or can be a chemical compound of Formula Ib

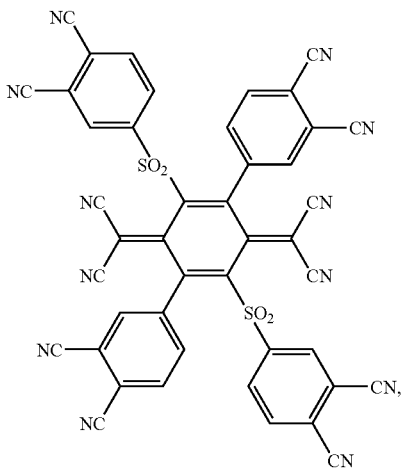

or can be a chemical compound of Formula Ic

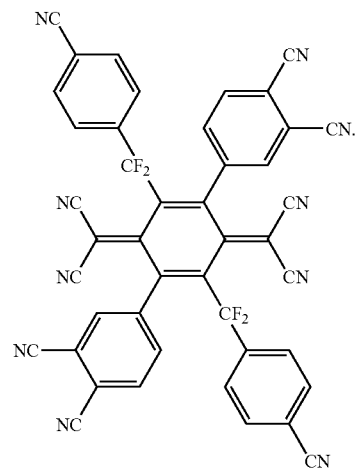

The organic material used in the $2^{nd}$ EIL 272 can be a chemical compound of

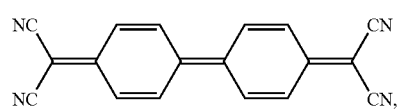

Formula IIa or can be a chemical compound of

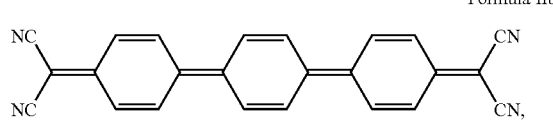

Formula IIb or can be a chemical compound of

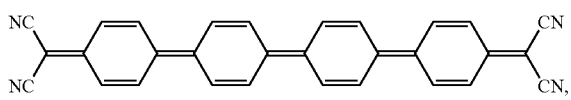
Formula IIc or can be a chemical compound of

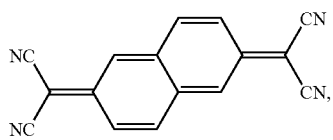
Formula IId or can be a chemical compound of

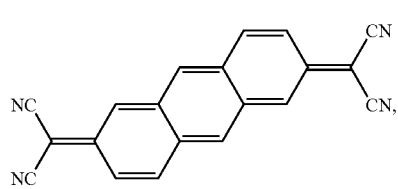
Formula IIe or can be a chemical compound of

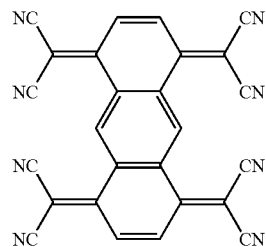
Formula IIf or a derivative any of these compounds resulting from replacement of one or more hydrogen atoms by substituents including of halo, nitrile (—CN), nitro (—$NO_2$), sulfonyl (—$SO_2R$), sulfoxide (—SOR), trifluoromethyl (—$CF_3$), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein two or more substituents combine form a ring structure including an aromatic ring, a heteroaromatic ring, or a nonaromatic ring, and each ring is substituted or unsubstituted.

The organic material used in the $2^{nd}$ EIL 272 can be a chemical compound of Formula III

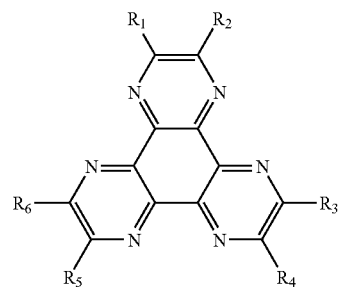

wherein $R_1$-$R_6$ represent hydrogen or a substituent independently selected from the group including halo, nitrile (—CN), nitro (—$NO_2$), sulfonyl (—$SO_2R$), sulfoxide (—SOR), trifluoromethyl (—$CF_3$), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein $R_1$ and $R_2$, $R_3$ and $R_4$, or $R_5$ and $R_6$, combine form a ring structure including an aromatic ring, a heteroaromatic ring, or a nonaromatic ring, and each ring is substituted or unsubstituted.

Specifically, the organic material used in the $2^{nd}$ EIL 272 can be a chemical compound of Formula IIIa (hexaazatriphenylene hexacarbonitrile)

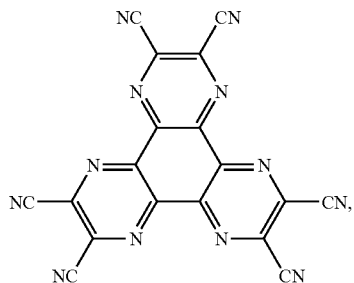

or can be a chemical compound of Formula IIIb

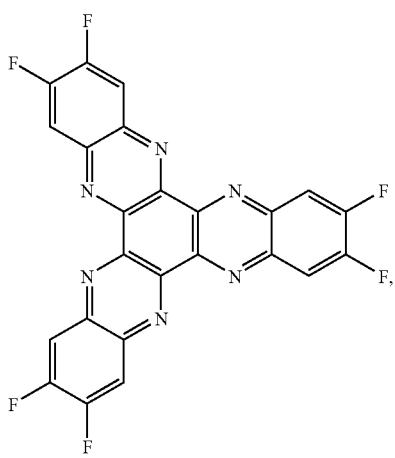

or can be a chemical compound of Formula IIIc

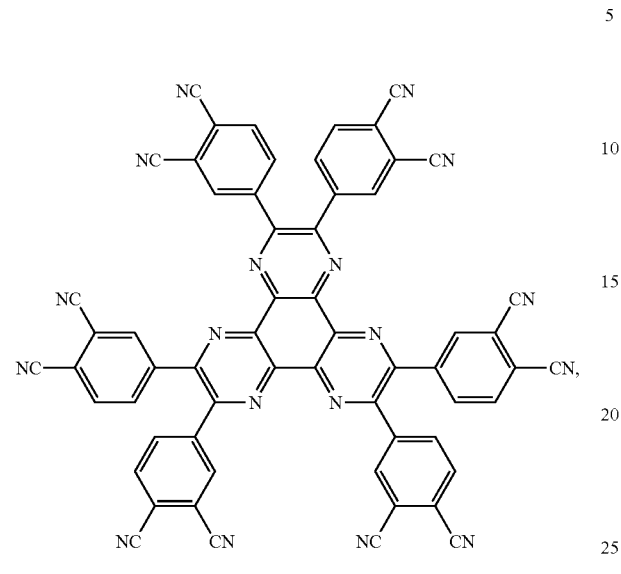

or can be a chemical compound of Formula IIId

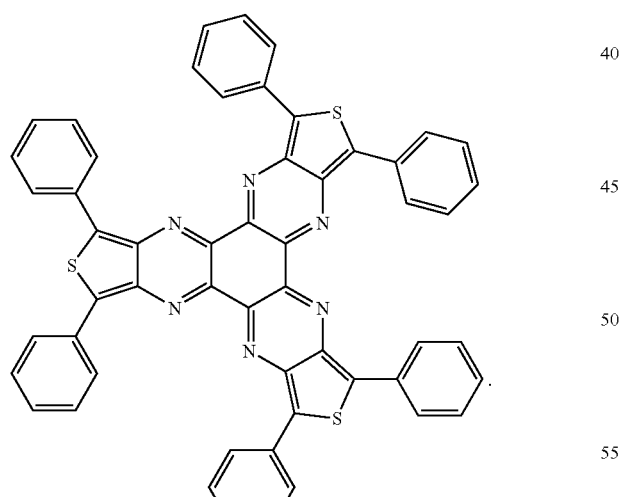

Additional organic materials that can be used in the 2$^{nd}$ EIL include diimide derivative of naphthalene tetracarboxylic diimide and of perylene tetracarboxylic diimide that are substituted with two or more fluoro groups, such as a chemical compound of Formula IVa

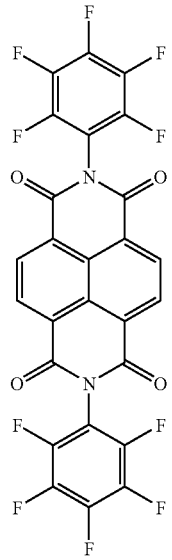

or a chemical compound of

Formula IVb

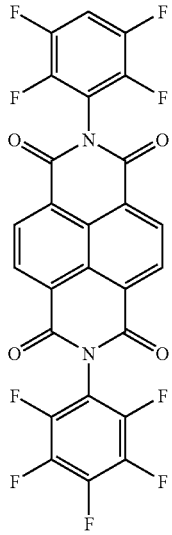

or a chemical compound of

Formula IVc or a chemical compound of

Formula IVd

It should be noted that in addition to the aforementioned types of materials, other materials useful to form the $2^{nd}$ EIL 272 can be selected from any material having the reduction potential is greater than −1.0 V. vs. SCE. It should also be noted that organic materials suitable for use in the $2^{nd}$ EIL 272 not only include the compounds containing at least carbon and hydrogen, but also include metal complexes, e.g., transition metal complexes having organic ligands and organometallic compounds, as long as their reduction potentials are in the appropriate range.

In order to have effective optical transparency and not absorb light produced by the device, the organic materials used in the $2^{nd}$ EIL 272 should preferably have an optical bandgap greater than 1.6 eV.

The $2^{nd}$ EIL 272 can also be doped with at least one n-type dopant material having a work function less than 4.0 eV into the organic host material. The n-type dopant for use in the $2^{nd}$ EIL 272 is selected from alkali metals, alkali metal compounds, alkaline earth metals, or alkaline earth metal compounds, or combinations thereof. Among the class of metal containing n-type dopants, Li, Na, K, Rb, Cs, Mg, Ca, Sr, Ba, La, Ce, Sm, Eu, Th, Dy, or Yb, and their compounds, are particularly useful. The n-type doped concentration is preferably in the range of 0.01-20% by volume of this layer. The n-type dopant used in the $2^{nd}$ EIL 272 can be the same or different from that used in the $1^{st}$ EIL 271.

Additional layers such as exciton, electron and hole-blocking layers as taught in the art can be employed in devices of this invention. Hole-blocking layers are commonly used to improve efficiency of phosphorescent emitter devices, for example, as in U.S. Patent Application Publications 2002/0015859 A1, 2003/0068528 A1, 2003/0175553 A1, WO 00/70655 A2, and WO 01/93642 A1.

Each of the layers in the organic EL units in the OLEDs can be formed from small molecule (or nonpolymeric) materials (including fluorescent materials and phosphorescent materials), polymeric LED materials, or inorganic materials, or combinations thereof.

When light emission is viewed solely through the anode, the cathode 180 can include nearly any conductive material. Desirable materials have effective film forming properties to ensure effective contact with the underlying organic layer, promote electron injection at low voltage, and have effective stability. Commonly used cathodes include a Mg:Ag alloy as described in U.S. Pat. No. 4,885,221, a LiF/Al bilayer as described in U.S. Pat. No. 5,677,572, Al, Ag, Au, Cu, or a combination thereof. Other useful cathodes include, but are not limited to, those disclosed in U.S. Pat. Nos. 5,059,861, 5,059,862, and 6,140,763. Since the $2^{nd}$ EIL 272 includes the organic material having a reduction potential greater than −1.0 V vs. SCE, the deposited cathode can form a stable interface with the $2^{nd}$ EIL 272 resulting in less interface degradation during operation as well as less dark spots due to less reaction with water or oxygen during storage. It is preferable that the barrier to injection of electrons from the cathode material into the $2^{nd}$ EIL be no greater than 0.3 eV. For example, if the $2^{nd}$ EIL 272 includes an organic material having a reduction potential of −0.5 V vs. SCE, which means that the LUMO position is about −3.8 eV, the cathode can be then selected from materials whose work functions are equal to or smaller than 4.1 eV.

When light emission is viewed through the cathode, the cathode should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, and EP 1 076 368. Cathode materials are typically deposited by thermal evaporation, electron beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

This invention can be used in a so-called tandem device architecture, for example, as taught in U.S. Pat. Nos. 6,337, 492, 6,717,358, and U.S. Patent Application Publication 2003/0170491 A1. Such tandem devices have multiple electroluminescent units provided between an anode and a cathode, typically with connector layer between units to promote charge production and injection into the electroluminescent units.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often including a tantalum material, e.g., as described in U.S. Pat. No. 6,237,529, or can be first coated onto a donor sheet and then sublimed in closer proximity to the substrate. Layers with a mixture of materials can use separate sublimation boats or the materials can be premixed and coated from a single boat or donor sheet. Patterned deposition can be achieved using shadow masks, integral shadow masks (U.S. Pat. No. 5,294,870), spatially defined thermal dye transfer from a donor sheet (U.S. Pat. Nos. 5,688,551, 5,851,709 and 6,066,357), and inkjet method (U.S. Pat. No. 6,066,357).

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well known optical effects in order to enhance its properties if desired. This includes optimizing layer thicknesses to yield maximum light transmission, providing dielectric mirror structures, replacing reflective electrodes with light-absorbing electrodes, providing anti glare or antireflection coatings over the display, providing a polarizing medium over the display, or providing colored, neutral density, or color conversion filters in functional relationship with the light emitting areas of the display. Filters, polarizers, and antiglare or antireflection coatings can also be provided over a cover or as part of a cover.

The OLED device can have a microcavity structure. In one useful example, one of the metallic electrodes is essentially opaque and reflective; the other one is reflective and semitransparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have ITO spacer layer placed between a reflective anode and the organic EL media, with a semitransparent cathode over the organic EL media.

The aforementioned OLEDs prepared in accordance with the present invention are useful in applications. OLED displays or the other electronic devices can include a plurality of the OLEDs as described above.

EXAMPLES

The following examples are presented for a further understanding of the present invention. In the following examples, the reduction potentials of the materials were measured using an electrochemical analyzer (CHI660 electrochemical analyzer, made by CH Instruments, Inc., Austin, Tex.) with the method as discussed before. During the fabrication of OLEDs, the thickness of the organic layers and the doping concentrations were controlled and measured in situ using calibrated thickness monitors (INFICON IC/5 Deposition Controller, made by Inficon Inc., Syracuse, N.Y.). The EL characteristics of all the fabricated devices were evaluated using a constant current source (KEITHLEY 2400 SourceMeter, made by Keithley Instruments, Inc., Cleveland, Ohio) and a photometer (PHOTO RESEARCH SpectraScan PR 650, made by Photo Research, Inc., Chatsworth, Calif.) at room temperature. Operational stabilities of the devices were tested at room temperature by driving a direct current of 80 mA/cm$^2$ through the devices.

Example 1 (Comparative)

The preparation of a conventional OLED is as follows: A~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the anode buffer layer by decomposing $CHF_3$ gas in an RF plasma treatment chamber. The substrate was then transferred into a vacuum deposition chamber for deposition of all other layers on top of the substrate. The following layers were deposited in the following sequence by evaporation from a heated boat under a vacuum of approximately $10^{-6}$ Torr:

1. EL Unit:
   a) an HIL, 10 nm thick, composed of hexaazatriphenylene hexacarbonitrile (HAT-CN);
   b) an HTL, 65 nm thick, composed of 4,4'-bis[N-(1-naphthyl)-N-phenylamino]biphenyl (NPB);
   c) a LEL, 30 nm thick, composed of tris(8-hydroxyquinoline)-aluminum (Alq) doped with 1.0 vol % 10-(2-benzothiazolyl)-1,1,7,7-tetramethyl-2,3,6,7-tetrahydro-1H,5H,11H(1)benzopyrano(6,7,8-ij)quinolizin-11-one (C545T); and
   d) an EIL, 30 nm thick, composed of Alq doped with about 1.2 vol % lithium.
2. Cathode: approximately 210 nm thick, composed of Mg:Ag (formed by co-evaporation of about 95 vol % Mg and 5 vol % Ag).

After the deposition of these layers, the device was transferred from the deposition chamber into a dry box (made by VAC Vacuum Atmosphere Company, Hawthorne, Calif.) for encapsulation. The OLED has an emission area of 10 mm$^2$. The reduction potentials of HAT-CN and Alq were measured as about −0.01 V and −1.77 V vs. SCE in the 1:1 MeCN/toluene organic solvent system, respectively.

This conventional OLED requires a drive voltage of about 5.0 V to pass 20 mA/cm$^2$. Under this test condition, the device has a luminance of 1905 cd/m$^2$, and a luminous efficiency of about 9.5 cd/A. Its emission peak is at 521 nm.

Example 2 (Comparative)

Another OLED was constructed as the same as that in Example 1, except that the 30-nm-thick Li-doped Alq layer (the EIL formed as layer d) in Example 1 was replaced by a 30-nm-thick HAT-CN layer as an EIL Example 2.

This OLED requires a drive voltage of about 5.4 V to pass 20 mA/cm$^2$. However, there is no light emission from this device. This observation indicates that the HAT-CN layer having a reduction potential greater than −1.0 V vs. SCE cannot be effectively used as an EIL in this device configuration.

Example 3 (Comparative)

Another OLED was constructed as the same as that in Example 1, except that the 30-nm-thick Li-doped Alq layer (the EIL, layer d) in Example 1 was replaced by a 30-nm-thick HAT-CN layer doped with about 1.2 vol % lithium as an EIL in Example 3.

This OLED requires a drive voltage of about 5.2 V to pass 20 mA/cm$^2$. However, there is no light emission from this device. This observation indicates that the Li-doped HAT-CN layer also cannot be effectively used as an EIL in this device configuration.

Example 4 (Comparative)

Another OLED was constructed in the same manner as that in Example 1. However, the layer structure of the EL unit is as follows:
  a) an HTL, 75 nm thick, composed of NPB;
  b) a LEL, 30 nm thick, composed of Alq doped with 1.0 vol % C545T; and
  c) an ETL, 30 nm thick, composed of Alq.

Figure 6:
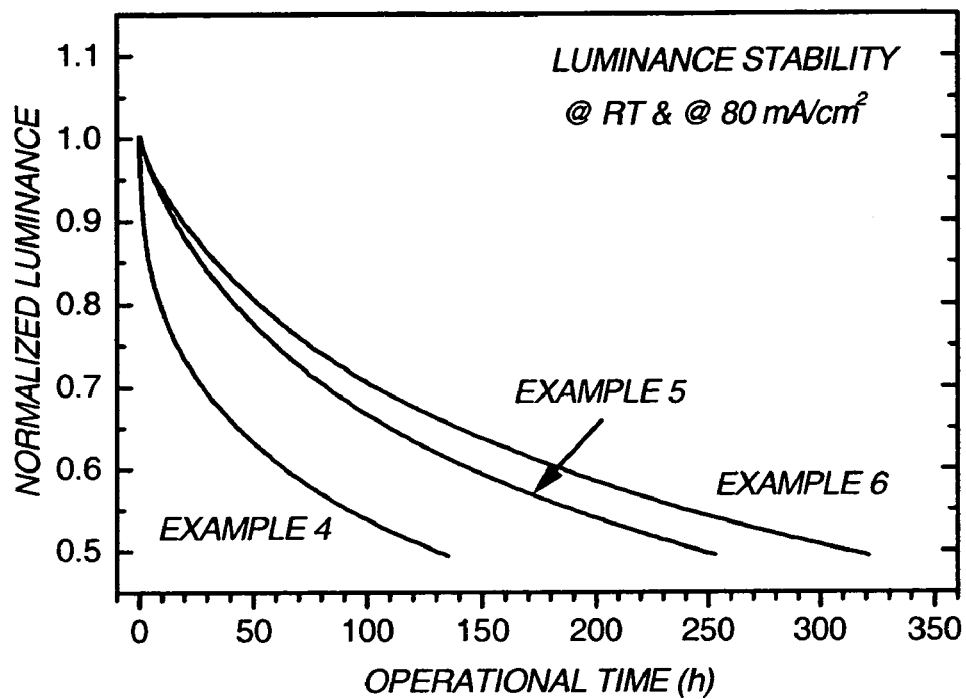
FIG. 6 is a graph showing the normalized luminance vs. operational time of a group of OLEDs tested at room temperature and at 80 mA/cm$^2$.
Figure 7:
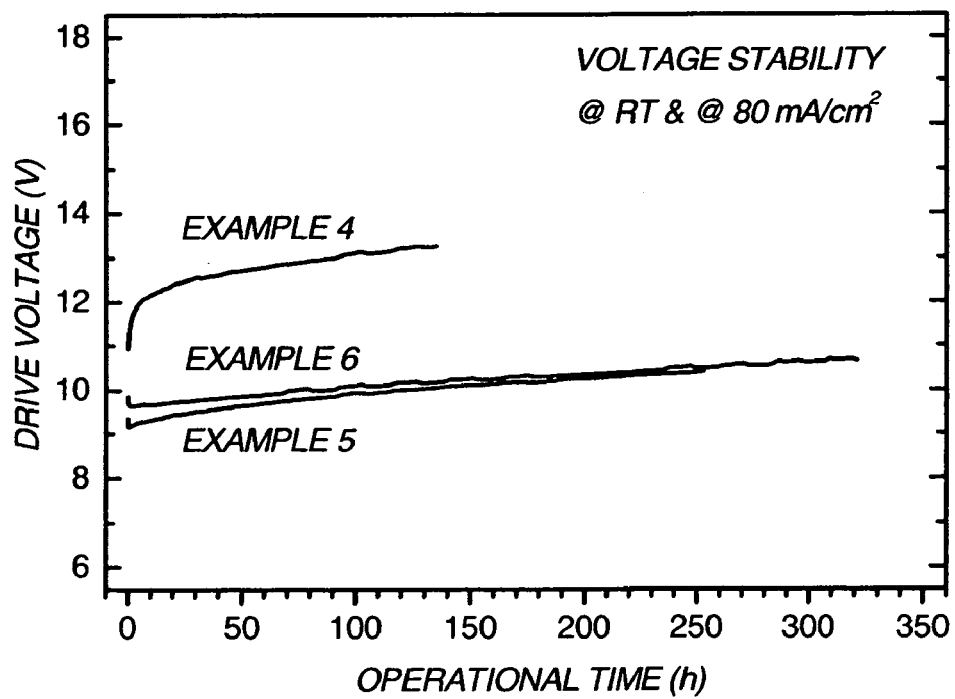
FIG. 7 is a graph showing the drive voltage vs. operational time of the group of OLEDs tested at room temperature and at 80 mA/cm$^2$.

This conventional OLED requires a drive voltage of about 6.6 V to pass 20 mA/cm$^2$. Under this test condition, the device has a luminance of 1977 cd/cm$^2$, and a luminous efficiency of about 9.9 cd/A. Its emission peak is at 522 μm. The operational lifetime was measured as $T_{50}(RT@80\ mA/cm^2)$ (i.e. the time at which the luminance has fallen to 50% of its initial value after being operated at room temperature and at 80 mA/cm$^2$). Its $T_{50}(RT@80\ mA/cm^2)$ is about 130 hours. The average rate of the voltage rise during the lifetime testing is about 17 mV/hr. Its normalized luminance vs. operational time and its drive voltage vs. operational time, tested at room temperature and at 80 mA/cm$^2$, are shown in FIGS. 6 and 7, respectively.

Example 5 (Comparative)

Another OLED was constructed as the same as that in Example 4, except that the layer c in Example 4 was replaced by:
  c) an EIL, 30 nm thick, composed of Alq doped with about 1.2 vol % lithium.

This OLED, requires a drive voltage of about 4.6 V to pass 20 mA/cm$^2$. Under this test condition, the device has a luminance of 2608 cd/m$^2$, and a luminous efficiency of about 10.0 cd/A. Its emission peak is at 522 nm. The operational lifetime, measured as $T_{50}(RT@80\ mA/cm^2)$, is about 246 hours. The average rate of the voltage rise during the lifetime testing is about 5.0 mV/hr. Its normalized luminance vs. operational time and its drive voltage vs. operational time, tested at room temperature and at 80 mA/cm$^2$, are shown in FIGS. 6 and 7, respectively.

Example 6 (Inventive)

An OLED in accordance with the present invention was constructed as the same as that in Example 4, except that the layer c in Example 4 was replaced by:
  c) the 1$^{st}$ EIL, 29 nm thick, composed of Alq doped with about 1.2 vol % lithium; and
  d) the 2$^{nd}$ EIL, 1 nm thick, composed of HAT-CN.

This OLED, having the 2$^{nd}$ EIL in direct contact with the 1$^{st}$ EIL, requires a drive voltage of about 5.0 V to pass 20 mA/cm$^2$. Under this test condition, the device has a luminance of 1891 cd/m$^2$, and a luminous efficiency of about 9.5 cd/A. Its emission peak is at 521 nm. The operational lifetime, measured as $T_{50}(RT@80\ mA/cm^2)$, is about 312 hours. The average rate of the voltage rise during the lifetime testing is about 3.5 mV/hr. Its normalized luminance vs. operational time and its drive voltage vs. operational time, tested at room temperature and at 80 mA/cm$^2$, are shown in FIGS. 6 and 7, respectively.

FIGS. 6 and 7 demonstrate that the OLED constructed in accordance with the present invention can have improved lifetime and improved voltage rise. The following examples will show how one can further reduce the drive voltage.

Example 7 (Inventive)

Another OLED in accordance with the present invention was constructed in the same general manner as that in Example 1. But, the layer structure of the EL unit is as follows:
  a) an HIL, 10 nm thick, composed of HAT-CN;
  b) an HTL, 65 nm thick, composed of NPB;
  c) a LEL, 30 nm thick, composed of Alq doped with 1.0 vol % C545T;
  d) the 1$^{st}$ EIL, 20 nm thick, composed of Alq doped with about 1.2 vol % lithium; and
  e) the 2$^{nd}$ EIL, 10 nm thick, composed of HAT-CN.

Figure 8:
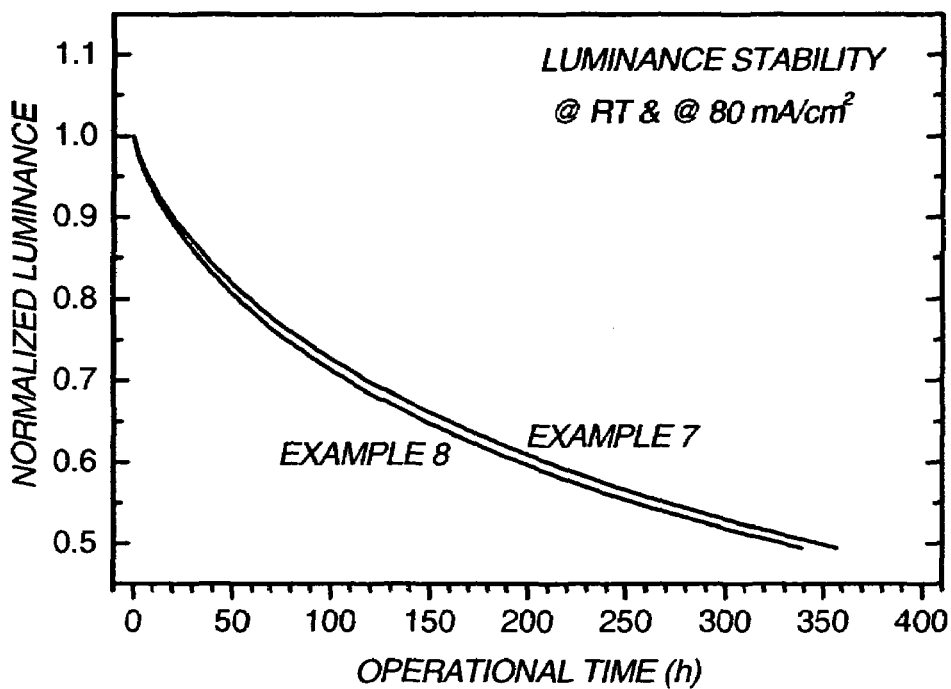
FIG. 8 is a graph showing the normalized luminance vs. operational time of another group of OLEDs tested at room temperature and at 80 mA/cm$^2$.
Figure 9:
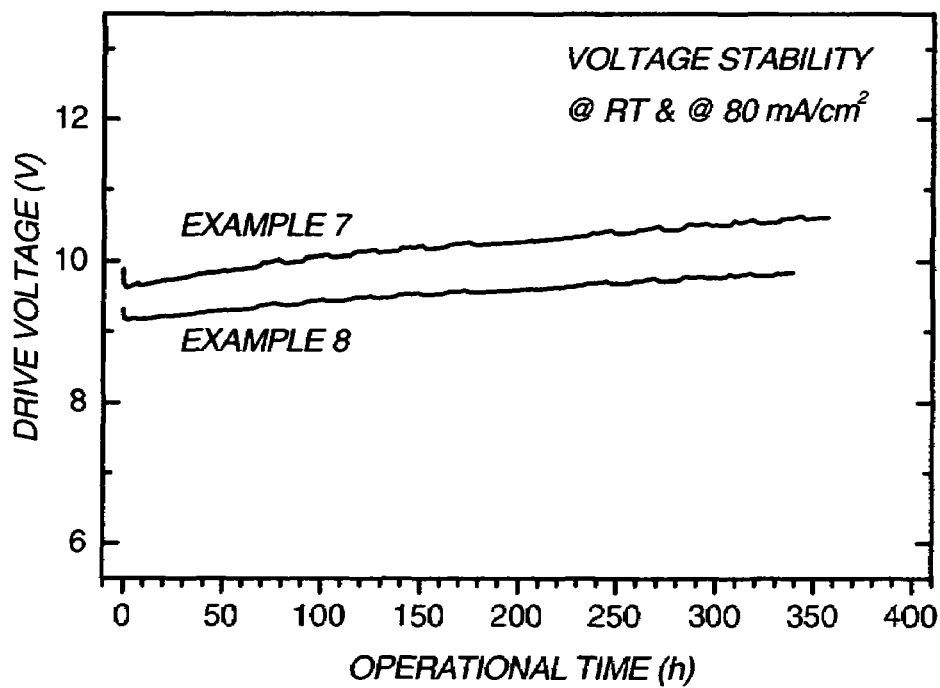
FIG. 9 is a graph showing the drive voltage vs. operational time of the other group of OLEDs tested at room temperature and at 80 mA/cm$^2$.

This OLED requires a drive voltage of about 5.1 V to pass 20 mA/cm$^2$. Under this test condition, the device has a luminance of 1823 cd/m$^2$, and a luminous efficiency of about 9.1 cd/A. Its emission peak is at 521 nm. The operational lifetime, measured as $T_{50}(RT@80\ mA/cm^2)$, is about 350 hours. The average rate of the voltage rise during the lifetime testing is about 2.9 mV/hr. Its normalized luminance vs. operational time and its drive voltage vs. operational time, tested at room temperature and at 80 mA/cm$^2$, are shown in FIGS. 8 and 9, respectively.

Example 8 (Inventive)

Another OLED was constructed in accordance with the present invention. This OLED is the same as that in Example 7, except that layers d and e were changed as follows:
  d) the 1$^{st}$ EIL, 5 nm thick, composed of Alq doped with about 1.2 vol % lithium; and
  e) the 2$^{nd}$ EIL, 25 nm thick, composed of HAT-CN doped with about 1.2 vol % lithium.

This OLED requires a drive voltage of about 4.6 V to pass 20 mA/cm$^2$. Under this test condition, the device has a luminance of 1898 cd/m$^2$, and a luminous efficiency of about 9.5 cd/A. Its emission peak is at 521 nm. The operational lifetime, measured as $T_{50}(RT@80\ mA/cm^2)$, is about 330 hours. The average rate of the voltage rise during the lifetime testing is about 2.1 mV/hr. Its normalized luminance vs. operational time and its drive voltage vs. operational time, tested at room temperature and at 80 mA/cm$^2$, are shown in FIGS. 8 and 9, respectively.

It is evident from FIGS. 8 and 9 that the OLEDs having a Li-doped HAT-CN layer as the $2^{nd}$ EIL can further reduce both the drive voltage and the voltage rise during operation.

The invention has been described in detail with particular reference to certain preferred embodiments thereof, but it will be understood that variations and modifications can be effected within the spirit and scope of the invention.

PARTS LIST

100 OLED
110 substrate
120 anode
130 hole-injecting layer (HIL)
140 hole-transporting layer (HTL)
150 light-emitting layer (LEL)
160 electron-transporting layer (ETL)
170 electron-injecting layer (EIL)
180 cathode
191 electrical conductors
192 voltage/current source
200 OLED
271 $1^{st}$ electron-injecting layer ($1^{st}$ EIL)
272 $2^{nd}$ electron-injecting layer ($2^{nd}$ EIL)
300 OLED
400 OLED
500 OLED

The invention claimed is:

1. An organic light-emitting device (OLED) comprising in the following order:
   a) an anode;
   b) a light-emitting layer disposed over the anode;
   c) a first electron-injecting layer disposed over the light-emitting layer, wherein the first electron-injecting layer includes at least one organic host material having a reduction potential less than −1.0 V vs. a Saturated Calomel Electrode selected from metal chelated oxinoid compounds and at least one dopant material capable of reducing the organic host material which is lithium;
   d) a second electron-injecting layer disposed in direct contact with the first electron-injecting layer, wherein the second electron-injecting layer includes at least one organic material having a reduction potential greater than −1.0 V vs. a Saturated Calomel Electrode and is selected from the chemical compounds having the structure of

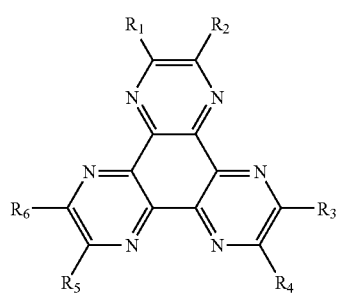

wherein $R_1$-$R_6$ represent hydrogen or a substituent independently selected from the group consisting of halo, nitrile (—CN), nitro (—NO$_2$), sulfonyl (—SO$_2$R), sulfoxide (—SOR), trifluoromethyl (—CF$_3$), ester (—CO—OR), amide (—CO—NHR or —CO—NRR'), substituted or unsubstituted aryl, substituted or unsubstituted heteroaryl, and substituted or unsubstituted alkyl, where R and R' are substituted or unsubstituted alkyl or aryl; or wherein $R_1$ and $R_2$, $R_3$ and $R_4$, or $R_5$ and $R_6$, combine to form a ring structure including an aromatic ring, a heteroaromatic ring, or a non-aromatic ring, and each ring is substituted or unsubstituted; and
   e) a cathode disposed in direct contact with the second electron-injecting layer.

2. The OLED of claim 1 wherein the at least one organic material in the second electron-injecting layer has a reduction potential greater than −0.5 V vs. a Saturated Calomel Electrode and has an optical band gap greater than 1.6 eV.

3. The OLED of claim 1 wherein the first electron-injecting layer has a thickness in a range of from 2 to 150 nm.

4. The OLED of claim 1 wherein the second electron-injecting layer has a thickness in a range of from 1 to 150 nm.

5. The OLED of claim 1 wherein the at least one organic host material in the first electron-injecting layer is tris(8-hydroxyquinoline)-aluminum (Alq).

6. The OLED of claim 1 wherein the at least one organic material in the second electron-injecting layer includes a chemical compound having the structure

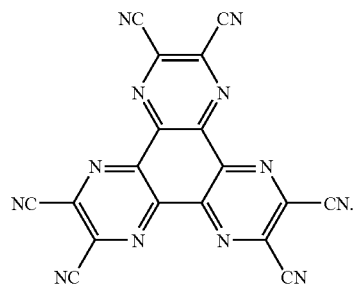

7. The OLED of claim 1 wherein the second electron-injecting layer includes at least one organic material having a reduction potential greater than −1.0 V vs. SCE and at least one dopant material having a work function less than 4.0 eV.

8. The OLED of claim 7 wherein the at least one dopant material in the second electron-injecting layer includes an alkali metal, alkali metal compound, alkaline earth metal, or alkaline earth metal compound.

9. The OLED of claim 7 wherein the at least one dopant material in the second electron-injecting layer is Li.

10. The OLED of claim 7 wherein the concentration of the at least one dopant material in the second electron-injecting layer is in the range of from 0.01% to 20% by volume.

11. The OLED of claim 1 wherein the device emits a red, green, blue, or white color.

12. An OLED display including a plurality of OLEDs according to claim 1.

13. The OLED of claim 1 wherein the at least one organic host material in the first electron-injecting layer is a 8-hydroxy-quinoline derivative.

* * * * *